US006770427B2

(12) United States Patent
Romero Salvo

(10) Patent No.: US 6,770,427 B2
(45) Date of Patent: Aug. 3, 2004

(54) DAMPING SOLUTION FOR OFFSET PRINTING PLATES AND METHOD AND DEVICE FOR THE PREPARATION THEREOF

(75) Inventor: Gerardo Antonio Romero Salvo, Barcelona (ES)

(73) Assignee: Delta Graf, S.A., Barcelona (ES)

( * ) Notice: Subject to any disclaimer, the term of this patent is extended or adjusted under 35 U.S.C. 154(b) by 244 days.

(21) Appl. No.: 10/168,833

(22) PCT Filed: Dec. 15, 2000

(86) PCT No.: PCT/ES00/00473

§ 371 (c)(1),
(2), (4) Date: Jun. 21, 2002

(87) PCT Pub. No.: WO01/47721

PCT Pub. Date: Jul. 5, 2001

(65) Prior Publication Data

US 2003/0010955 A1 Jan. 16, 2003

(30) Foreign Application Priority Data

Dec. 23, 1999 (ES) ............................................ 9902829

(51) Int. Cl.$^7$ .............................. G03F 7/40; C09K 3/18
(52) U.S. Cl. ............................ 430/331; 101/451; 106/2
(58) Field of Search ......................... 430/331; 101/451; 106/2

(56) References Cited

U.S. PATENT DOCUMENTS

| | | | | |
|---|---|---|---|---|
| 3,829,319 A | | 8/1974 | Suzuki et al. | |
| 4,764,213 A | | 8/1988 | Gventer et al. | |
| 5,338,344 A | * | 8/1994 | Bondurant | 106/2 |
| 5,720,800 A | | 2/1998 | Matsumoto | |

FOREIGN PATENT DOCUMENTS

| | | |
|---|---|---|
| EP | 770501 | 5/1997 |

* cited by examiner

*Primary Examiner*—Hoa Van Le
(74) *Attorney, Agent, or Firm*—Sughrue Mion, PLLC

(57) ABSTRACT

Humidifying solution for offset printing sheets and method and device for its preparation.

The solution is formed by between 95% and 97% of water and between 3% and 5% of an additive which contains sodium citrate, acetic acid, citric acid and sodium benzoate, characterized because the aforementioned additive contains between 0.0% and 0.5% in weight of sodium hexametaphosphate, between 0.0% and 1.5% in weight of ascorbic acid, between 0.0% and 1.0% in weight of preventol, between 0.0% and 1.0% in weight of sodium benzoate, between 0.0% and 1.0% in weight of citric acid, between 2% and 10% in weight of glycerin, between 0.0% and 0.1% in weight of limonal, between 50% and 75% in weight of sorbitol, between 1% and 2% in weight of acetic acid, between 3% and 7% in weight of citric acid, between 0.0 and 1.0% in weight of sodium oleate and between 15% and 30% in weight of osmotic water.

Method for the preparation of a humidifying solution according to claim 1 or 2, of the type which comprise a preliminary phase for the adsorption of oxygen by the means of the thrusting, over the free surface of humidifying solution, of recircled fractions of the solution, characterized because the solution is forced to flow at high speed by a pipe with a helicoidal configuration and is projected thus forming a 90-degree solid angle output cone, in such a way that a part of the particles of the projected thrust collide against the free surface of the humidifying solution, obtaining on said free surface an isothermal of constant adsorption.

The invention also covers the device for the preparation of said humidifying using said method.

10 Claims, 1 Drawing Sheet

DAMPING SOLUTION FOR OFFSET PRINTING PLATES AND METHOD AND DEVICE FOR THE PREPARATION THEREOF

This application is a 371 of PCT/ES00/00473, filed Dec. 15, 2000. The disclosure of which is incorporated herein by reference.

TECHNICAL SECTOR OF THE INVENTION

The invention relates to a humidifying solution for offset print sheet and to a procedure and to a device for the preparation of said humidifying solution.

Specifically, the humidifying solution of the invention is of the type that are formed by between 95% and 97% of water and between 3% and 5% of an additive which contains sodium citrate, acetic acid, citric acid and sodium benzoate.

The procedure to obtain the humidifying solution to which the invention refers is of the type which contains a preliminary phase of oxygen adsorption by the means of projecting a thrust, over the free surface of the humidifying solution, of recircled fractions of the humidifying solution.

The device for the preparation of the humidifying solution according to the invention is of the type which contains a main container reservoir for the solution, an outlet pipe for the solution provided with a first pump that recircles part of the solution back to some means for thrust propulsion of the recircled fraction over the free surface of the solution, which is present in an annex container reservoir, main and independent from it, a feeding pipe which communicates said annex compartment with the humidifying bucket for the humidifying cylinder of an offset printing machine and a feedback pipe for the solution in the humidifying bucket to main container reservoir.

STATE OF THE ART

The offset printing is an indirect printing fashion in which three cylinders are used: the printing sheet is mounted on the first cylinder; the second cylinder transmits the image to a second cylinder, which is covered by a rubber layer, which prints the paper which traverses between itself and a third cylinder which is only for pressing purposes. The pressing sheet is covered with photo-sensible emulsions in the shape of colloids which, when exposed to light, polymerize creating some surface zones which are lipophilic or similar to printing ink, which are fat bodies and hidrophilic metallic zones without images, which repel the ink.

A first set or rollers provide the printing ink to the first cylinder that the sheet has and the other set of rollers wets the sheet. The image zones accept ink, while the blank ones reject it. The addition of wetness to the sheet is achieved using what are called wetting systems.

The offset printing is a system based in surface physic and chemical phenomena, that is it is not a system based on relief, like typography, flexography, tampography, etc., but it is a planographic system in which the phase previous to the transferring of the ink to the paper consists in chemical attractions and repulsions between the different lipophilic and hidrophilic substances. Therefore, both the water and the ink must have a set of adequate physical and chemical characteristics that allow that the process be the right one.

Around this idea, and keeping in mind that the water with which the offset machines work is regular network water, there is the need to add some special additives to the water so that it gets determined properties in pH and surface tension, among others.

Among the wetting systems, the water alcohol system can be pointed out. It consists in adding, besides some additives, between 10% and 12% of isopropil alcohol to the water. The water alcohol system is the most developed and extended one because the quality parameters with this system are far better than with any other system, for example those called in the “integral” and “conventional” techniques. The basis for this good behavior is that the isopropyl alcohol provides a good interfacial tension between the water and the ink which brings the consequence a better water in the ink emulsion, so the printed ink is more vivid than with any other known wetting system.

Some other additional advantages are that the wetting system with isopropylic alcohol provides a higher viscosity that allows a more uniform image transference, a faster drying speed and a decrease in the surface tension that allows the water layer over the sheet to be very thin and to have a lower tendency to the mechanical emulsion.

However, for some years now, very rigorous studies are being conducted on the possible toxicity that the isopropylic alcohol based systems can present due to a prolonged exposure. In this sense, some countries have absolutely forbidden its use, while in some others its use has been largely restricted and in our country it is on its way to being forbidden for good.

Apart from toxicity, they present storing difficulty problems and danger of inflammability.

Many manufacturers have unsuccessfully tried to formulate additives that satisfy the aforementioned quality needs and refrains completely from using the isopropyl alcohol. The reason of the failed tries is in essence that the need to have to reduce the surface tension to avoid that the water ink emulsion to levels which can be compared to the water alcohol system obligates the use of tensoactives of group III. A larger concentration of these tensoactives originates a decrease in the interphase by affinity between the ink fat acids and the tensoactives hydro-carburated strings. The tensoactives cause a great deal of foam and, because they are no volatile, they remain in the ink rollers, thus accumulating and causing operating problems.

The former, together with the impossibility to form stable colloids based on other substances that reduce the surface tension and maintain a larger water ink interphase are the main reasons why it has been impossible to substitute the isopropyl alcohol.

European patent number EP-A-0 770 501 introduces some improvements in wetting systems for offset printing, consisting in feeding the wetting system with a dissolution based on water and some determined additive. The dissolution is subjected to some collision phenomena during which it acquires, due to an adsorption process, an important amount of oxygen, with which it is achieved that the dissolution that wets the printing sheet, based on which the impression is made, acquires a large amount of free oxygen, thus increasing the water ink inter-phase.

Also, the EP-A-0 770 501 describes the device for the preparation of the solution, which consists of a main container reservoir for the solution, an outlet pipe provided with a first pump that recircles part of the solution towards some means for thrust projection of the recircled fraction over the free surface of the present solution in a compartment annex to the main container and independent from it, a feeding pipe, which communicates said annex compartment with the wetting bucket of the wetting cylinder of an offset printing machine and a feedback pipe for the wetting bucket solution to the main container reservoir.

Said improvements and device, even if they have a correct functionality and provide a good final quality, lack that the collision of the recircled fraction against the free surface does not achieve a constant adsorption isothermal on the surface of the solution, which would be desirable for getting a larger uniformity of extension of the humidifying layers over the printing sheet.

The goal of the invention is to provide an effective solution to all problems listed above.

EXPLANATION OF THE INVENTION

To that extent, the invention makes public the humidifying solution, which in essence is characterized because the aforementioned additive contains between 0.0% and 0.5% in weight of sodium hexametaphosphate, between 0.0% and 1.5% in weight of ascorbic acid, between 0.0% and 1.0% in weight of sodium benzoate, between 0.0% and 1.0% in weight of citric acid, between 2% and 10% in weight of glycerin, between 0.0% and 0.1% in weight of limonal, between 50% and 75% in weight of sorbitol, between 1% and 2% in weight of acetic acid, between 3% and 7% in weight of citric acid, between 0.0 and 1.0% in weight of sodium oleate and between 15% and 30% in weight of osmotic water.

According to one other feature of the humidifying solution of the invention, the aforementioned additive is constituted by 0.1% in weight of sodium hexametaphosphate, 0.3% in weight of ascorbic acid, 0.2% in weight of preventol, 0.2% in weight of sodium benzoate, 0.2% in weight of citric acid, 5% in weight of glycerin, 0.05% in weight of limonal, 65% in weight of sorbitol, 1.5% in weight of acetic acid, 5% in weight of sodium citrate, 0.2% in weight of sodium oleate, and 22.25% in weight of osmotic water.

The invention also has the goal to a method to obtain the aforementioned humidifying solution, characterized because the solution is forced to flow at high speed by a pipe with a helicoidal configuration and is projected thus forming a 90-degree solid angle output cone, in such a way that a part of the particles of the projected thrust collide against the free surface of the humidifying solution, obtaining on said free surface a isothermal of constant adsorption.

According to one other feature of the invention, the humidifying solution is projected at a lineal speed between 1,3 m/s and 220 m/s and at a pressure up to 1,500 kg/cm2.

According to one other feature of the invention, said lineal speed is 60 m/s and said pressure is 250 kg/cm2.

Another goal of the invention is a device for the preparation of a humidifying solution according to the invention using the method described above, which in essence is characterized because the aforementioned projection means are constituted by an injector which makes the solution turn at high angular speeds in a helicoidal trajectory and subject to very high pressures, so that the solution is projected forming a output cone of 90 degrees of solid angle, so that a part of the particles of the projected thrust collide against a deflecting surface and the rest of the particles collide against a free surface of the humidifying solution an isothermal of constant adsorption.

Preferably, the aforementioned injector has an initial acceleration part in a helicoidal trajectory and right after it a second diffusion part of toroidal configuration, so that the humidifying solution is projected over said free surface and against said deflecting surface at a lineal speed between 1,3 m/s and 220 m/s and at a pressure up to 1,500 kg/cm2.

In an actual realization of the invention, the lineal speed is 60 m/s and said pressure is 250 kg/cm2.

According to one other feature of the invention, said deflecting surface makes an angle of between 0 degrees and 30 degrees with said liquid free surface.

Preferably, said deflecting surface (4) makes a 15-degree angle with the said liquid free surface.

BRIEF DESCRIPTION OF THE DRAWINGS

Next, there is a description of an actual realization of the invention, although not exclusive, for whose better understanding a set of drawings is accompanied, give merely as non-limiting examples, in which.

DETAILED DESCRIPTION OF THE DRAWINGS

Figure 1:
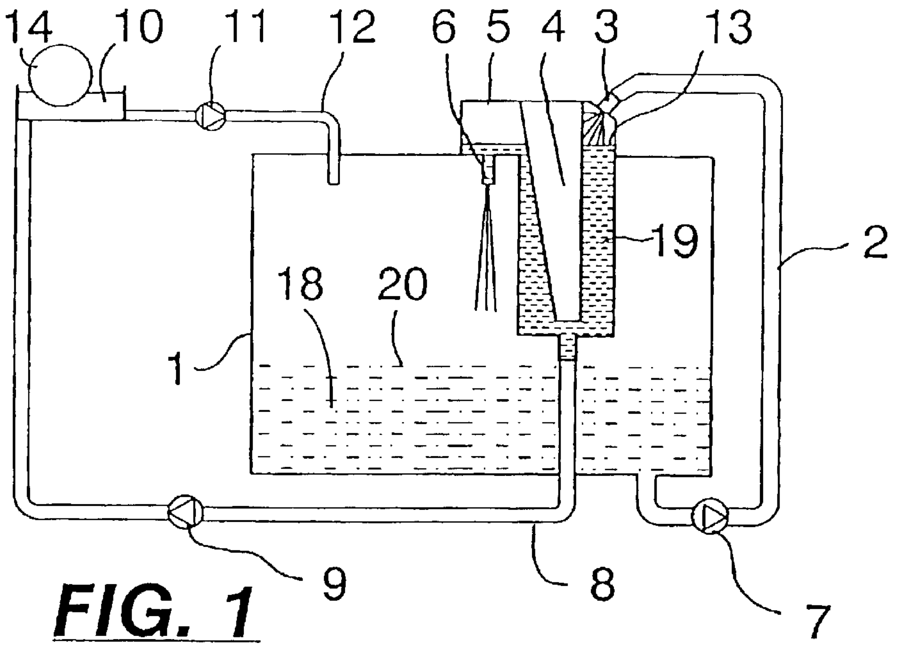
FIG. 1 is a schematic view of a device according to the invention.

In said drawings, it can be seen that the device according to the invention comprises a main container reservoir 1 for the humidifying solution 18 for the wetting cylinder 14 of an offset printing machine. The set has an compartment 5 annex to the main reservoir 1, destined for containing a fraction 19 of the recircled humidifying solution 18. The free surface 13 of the annex compartment 5 is at a higher level than the free surface 20 of the main reservoir 1.

The main container reservoir 1 is connected to an output pipe 2 for the humidifying solution 18, provided with a first pump 7 that pushes to the annex compartment 5 the recircled fraction 19, which is projected at high speed and pressure by the means of an injector 3, in such a way that the interior of the compartment 5 is subjected to pressure.

The annex compartment 5 is provided in its interior with a deflecting surface 4, destined for receiving the impact of part of the recircled fraction thrust 19 of the humidifying solution 18 when it is projected by the injector 3.

It has been proven that an affective way to take into practicality the device of the invention is the one in which the deflecting surface 4 makes an angle of between 0 degrees and 30 degrees with said liquid free surface, with the optimal solution being that whose angle is 15 degrees.

Figure 2:
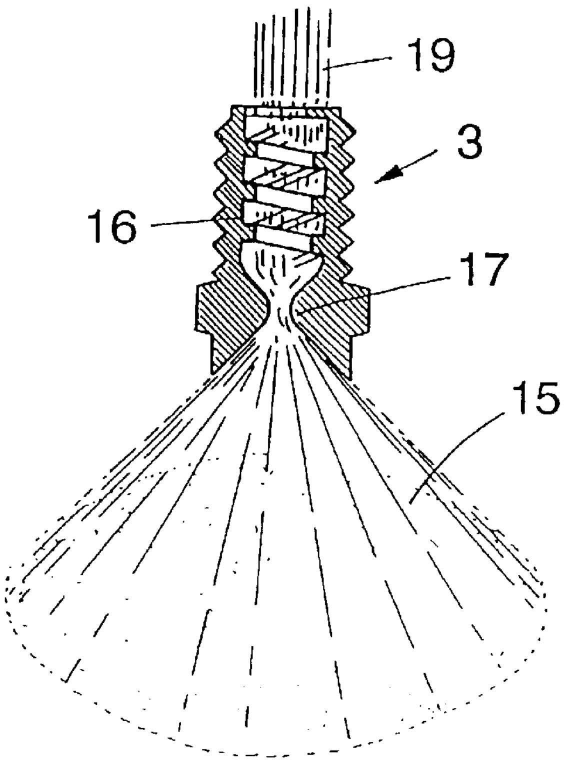
FIG. 2 is a section representation of an injector according to the invention in which a cut has been made for a better understanding.

In FIG. 2, it can be seen that the injector 3 has a first acceleration part 16 in helicoidal trajectory and, right after it a second diffusion part 17 with toroidal configuration, which makes the solution turn at high angular speeds in a helicoidal trajectory and at high pressures. The humidifying solution 18 is projected by injector 3 forming a output cone 15 of 90 degree of solid angle. Part of the particles of the thrust collide against the deflecting surface 4 and the rest of the particles, against the free surface 13 of the humidifying solution, obtaining on said surface a constant adsorption isothermal. Injector 3 can provide a lineal speed between 1.3 m/s and 220 m/s and a pressure of up to 1,500 kg/cm2, preferably 60 m/s and 250 kg/cm2, respectively.

The annex compartment 5 is communicated, via a feeding pipe 8, with the one with which it connects with its lower part, with a wetting bucket 10 of the wetting cylinder 14 of the offset printing machine, and to a feedback pipe 12 for the humidifying solution 18 from the wetting bucket 10 to the main container reservoir 1. The fraction of the humidifying solution that goes from the annex compartment 5 to the wetting bucket 10 is pushed by a second pump 9. The feedback pipe 12 is provided with a third pump 11, for the remaining fraction of the humidifying solution 18 that has not been incorporated to the printing sheet.

The annex compartment 5 is also communicated with the main reservoir 1 with the aid of a spiller 6 that spills because of gravity and in collaboration with the present pressure within the annex compartment 5.

The described device is particularly designed for the execution of the method of the invention for the preparation of the humidifying solution 18 for the offset printing sheets.

Said humidifying solution 18 is formed by between 95% and 97% of water and between 3% and 5% of an additive which contains between 0.0% and 0.5% in weight of sodium hexametaphosphate, between 0.0% and 1.5% in weight of ascorbic acid, between 0.0% and 1.0% in weight of sodium benzoate, between 0.0% and 1.0% in weight of citric acid, between 2% and 10% in weight of glycerin, between 0.0% and 0.1% in weight of limonal, between 50% and 75% in weight of sorbitol, between 1% and 2% in weight of acetic acid, between 3% and 7% in weight of citric acid, between 0.0 and 1.0% in weight of sodium oleate and between 15% and 30% in weight of osmotic water.

The composition of the cited additive is constituted by 0.1% in weight of sodium hexametaphosphate, 0.3% in weight of ascorbic acid, 0.2% in weight of preventol, 0.2% in weight of sodium benzoate, 0.2% in weight of citric acid, 5% in weight of glycerin, 0.05% in weight of limonal, 65% in weight of sorbitol, 1.5% in weight of acetic acid, 5% in weight of sodium citrate, 0.2% in weight of sodium oleate, and 22.25% in weight of osmotic water.

The method of the invention is based on modifying the molecular structure of the water for the humidifying by forming gas surfaces of O2 similar to those formed with colloids in association, achieving that all the humidifying solution 18 layer applied to the printing sheet acquires a large amount of free oxygen.

In essence, on the surface 13 of the humidifying solution 18 some "vapor gas surfaces" are formed, which are obtained by subjecting the solution to colliding phenomena at high speed and pressure, projecting with the means of injector 3 a recircled fraction of the solution, this volume being the one that feeds in a continuous way the wetting system. Next, an explanation for the physical and chemical phenomena which rule the aforementioned structural modification of water is given.

A colloid differs from a dissolution basically in the size of the particles: from 0,1 mm to 1 mm in the first case and between 1 mm and several mm in the case of the colloids. There exist three types of colloids, namely: colloidal dispersions, macromolecule solutions and association colloids.

Next, the fundamentals of the association colloids are explained briefly, which are, among the three types listed, the ones that pertain to the physics and chemistry of the offset printing.

The substances that in solution get the name of association colloids are basically soaps and humidifying agents.

In the conventional additives that are currently used in the printing industry, humidifying agents in one or several varieties are found. In a generic way, it can be said that these additives generally are aliphatic or mixed (aliphatic and aromatic) strings along with very strong polar groups to make them soluble.

Taking into consideration their insolubility, in absence of said additives, of these strings in dissolution, the situation thermodynamically more stable is the grouping in what is called as micelles. And on the surface, the situation of a lesser energy is verified with the polar group in dissolution and the hydrophobic string outside the water.

These surfaces that have the property to present less surface tension than pure water are known as "gas vapor surfaces". The interactions that exist are always solute-solvent, because if only solute-solute interactions existed, it would be before homogeneous surfaces, or even condensed, which are not the right kind for the case that occupies us.

Taking the former into consideration, it is understood that the creation of any new surface in an association colloid originates instantaneously a gas vapor surface, the general base for the working of the wetting additives.

If ink is spread on a surface of pure water, the ink will rapidly spread on the water forming a layer. This happens because the so-called "Initial Extension Coefficient (S)" is zero or positive. The initial extension coefficient is given by the formula:

$$S=\gamma w-(\gamma w/t-\gamma t)$$

where γw is the tension component in the interphase water-ink with respect to the horizontal, t is the size of the bubbles created and γt the tangent component force in the interphase water-ink, or to the contact angle.

When a conventional additive is added to water, it happens that there is no extension, in part because the surface tension has been decreased and in part because γw has ceased to be null and has taken the value of 30 degrees. Therefore, these two causes make the system to be stable in the condensed form.

However, in this new case, the value of γw/t has decreased. That is, the addition of a humidifying has reduced the surface tension.

In theory, it could be assumed that adding only alcohol to water and thus reducing the surface tension something similar should happen. However, it does not work that way. In any event, it is necessary the presence of a humidifying for the system to be stable in condensed state. The tension in the interphase with only alcohol is not large enough to produce this effect.

For that purpose, like it has already been said, the presence of an additive that in a similar way to prior case modifies the contact angle is required. However, the value of γw/t with alcohol is comparatively rather bigger and this is the fundamental cause for its good working.

Because it is impossible to form stable colloids (without tensoactives) to reduce the surface tension, and knowing that all the current existing substitutions have a behavior which is not particularly good or acceptable, the principles of the invention achieve solving the problem by the means a completely different approach.

It has been proceeded to try a similar adsorption to the Langmuir Type 1, that is, an adsorption in which the adsorption speed of a gas over a solid, v, depends on a constant K1, of the fraction of covered surface, D, and on the pressure, P:

$$v=K1(1-D)*P$$

In the case of the system of the invention, besides the pressure, because it is an adsorption over the surface of a liquid, the speed of condensation has been proven to depend on a factor related to the number of collisions of air bubbles and also on their size of over the liquid surface. Therefore, the speed can be represented by the following formula:

$$v=K3(1-D)*P*C$$

Where $$c=f(N, t)$$

Where N is the number of collisions per time unit.

Where N is the number of collisions per time unit.

The system of the invention does not work over a Gibbs isothermal, in which the adsorption processes are stable and always measurable depending on the concentration of the humidifying and on the variation of the surface tension with its concentration, as it would be according to the following equation:

$$R=C/RT(dt/dc)T$$

But it produces a reversible adsorption isothermal in which:

$$V=K2*D$$

And in which an internal fraction of volume of the humidifying solution does not present these conditions at any moment, but only the free surface 13 of the humidifying solution present in the annex compartment 5 originates this phenomenon.

Therefore, it has been determined that the increase of the interfacial tensions derived from function C can be obtained from experiments in which it has been worked with the following parameters:

a) different formulations, with different sensibilities of the emulsion to the air;
b) different speed of the fluid under pressure over the volume to deal with;
c) different ratio surface-volume of the fluid to deal with;
d) different collecting zones of the fluid to pump to the water tray 10 (FIG. 1); and
e) different additional treatments of turbulence over the water tray 10, only in specific cases.

The procedure according to the invention achieves that the water that the wetting rollers 14 collect from the water trays 10 gets to O2 adsorption conditions to the sheet, adequate for, on one side to create interphase tension higher than that of the water alcohol system, and on the other a layer of water so thin it does not cause excessive emulsion.

This phenomenon happens thanks to the O2 adsorption on the water surface in contact with the wetting roller 14, gets transmitted with the rest of the system's wetting roller, and from those to the hydrophilic zone of the sheet.

An expert on this sector of the technique is aware of the fact that the additive does not incorporate any tensoactive from group III. A wetting dissolution with a tensoactive and without adsorption treatment produces spreading of the ink over the water as a consequence of that the surface tension of the water does not decrease, and therefore the extension coefficient is zero or positive, which is not desirable.

However, the method of the invention, once the O2 adsorption over the surface of the wetting water has happened, not only there is no extension but the speed of flocculation of a thin layer of ink (tested in a laboratory and machine) is much larger than in water-additive-alcohol.

This means that the extension coefficient is less in the system according to the invention than in the conventional water-alcohol, which means a clear advantage.

The printers know from experience that in the inmerser roller 14 of a water-alcohol wetting system, the chromate must present, as it runs, an aspect of a thin water layer, which is indicative that the surface tension is the ideal mixture. When the surface tension increases (for instance, because the alcohol concentration has decreased) this thin layer breaks causing water extension problems over the rollers and the sheet, obligating them to increase the system water flow and the speed.

The adsorption on the surface that the system of the invention produces, creates a situation similar to that of the alcohol, and even when the resulting surface tension of the additive is close to 72 di-nas/cm it is deduced that when the system of the invention has produced enough surface O2 adsorption, the same phenomenon happens over the inmerser roller as a consequence of the fact that the surface tension over said roller has decreased.

From the experimental development, test undertaken in workshops and in real tests the following results are obtained, which will be clear for an expert on the technique:

isopropylic alcohol total elimination;

more uniformity of the extension of the ink over the sheet;

a thinner and more homogeneous over the sheet;

lower emulsion of water over ink;

better extension of ink over the set with less water and less paper particles;

colors more vivid;

ink savings of up to 14% in normal offset and even higher in UV;

higher drying speed of the ink;

reduction and in some cases of anti-spot dusts;

better "wet over wet" impression in a multicolor machine with a higher ink transparency;

important improvement of the "additionability" and "trapping";

better "impasted";

better contrast;

better gain point;

less stops for cleaning and the rubber layer; and better reproduction of the weft between 1% and 99%, with very good results with special wefts, such as the "stochastics".

Described in sufficiency the invention, as well as the way to put it into practice, let it be patent that all that which does not alter, change or modify it fundamental principle, it can be subject to detail variations, being the main and that is why the present patent is being applied for twenty years, which is glossed in the following claims.

What is claimed is:

1. A humidifying solution for offset printing sheets comprising:

(A) 95%–97% of water; and (B) 3%–5% of an additive comprising:

(i) 0.0%–0.5% by weight of sodium hexametaphosphate,
(ii) 0.0%–1.5% by weight of ascorbic acid,
(iii) 0.0%–1.0% by weight of preventol,
(iv) 0.0%–1.0% by weight of sodium benzoate,
(v) 0.0%–1.0% by weight of citric acids.
(vi) 2%–10% by weight of glycerin,
(vii) 0.0%–0.1% by weight of limonal,
(viii) 50%–75% by weight of sorbitol,
(ix) 1%–2% by weight of acetic acid,
(x) 3%–7% by weight of sodium citrate,
(xi) 0.0–1.0% by weight of sodium oleate, and
(xii) 15%–30% by weight of osmotic water.

2. The humidifying solution of claim 1, wherein said additive comprises:

(i) 0.1% by weight of sodium hexametaphosphate,
(ii) 0.3% by weight of ascorbic acid,
(iii) 0.2% by weight of preventol,
(iv) 0.2% by weight of sodium benzoate, (v) 0.2% by weight of citric acid, (vi) 5% by weight of glycerin, (vii) 0.05% by weight of limonal, (viii) 65% by weight of sorbitol, (ix) 1.5% by weight of acetic acid, (x) 5% by weight of sodium citrate, (xi) 0.2% by weight of sodium oleate, and (xii) 22.25% by weight of osmotic water.

3. A method for preparing the humidifying solution of claim 1, comprising the steps of:

(a) admixing components (A) and (B) to form a solution;

(b) adsorbing oxygen from said solution by projecting, over the free surface of the resulting solution of step (a), recycled portions of said solution, wherein said portions are projected at very high pressures so that the projected solution turns at high angular speeds in a helicoidal trajectory to form a 90° solid angle output cone, in such a way that a portion of the particles of said projected solution collide against the free surface of said solution, thus obtaining in said free surface an isothermal of constant adsorption.

4. The method of claim 3, wherein said portions of said solution are projected at a lineal speed of 1.3–220 m/s and at a pressure of up to 1500 $kg/cm^2$.

5. The method of claim 4, wherein said lineal speed is 60 m/s and said pressure is 250 $kg/cm^2$.

6. A device for preparing a humidifying solution for offset printing sheets, wherein said humidifying solution is formed by admixing;

(A) 95%–97% of water; and (B) 3%–5% of an additive comprising:

(i) 0.0%–0.5% by weight of sodium hexametaphosphate, (ii) 0.0%–1.5% by weight of ascorbic acid, (iii) 0.0%–1.0% by weight of preventol, (iv) 0.0%–1.0% by weight of sodium benzoate, (v) 0.0%–1.0% by weight of citric acid, (vi) 2%–10% by weight of glycerin, (vii) 0.0%–0.1 by weight of limonal, (viii) 50%–75% by weight of sorbitol, (ix) 1%–2% by weight of acetic acid, (x) 3%–7% by weight of sodium citrate, (xi) 0.0–1.0% by weight of sodium oleate, and (xii) 15%–30% by weight of osmotic water;

said device comprising:

a main container (1) for containing said solution;

an annex compartment (5), including a deflecting surface (4), for containing said solution and a free surface (13) of said solution;

an injector (3), including a part having a helicoidal configuration, that is capable of projecting recycled portions of said solution over said free surface of said solution in said annex compartment to adsorb oxygen from said solution, thus obtaining in said surface an isothermal of constant adsorption;

an outlet pipe (2) including a first pump (7) that is capable of recycling portions of said solution from said main container to said injector;

a humidifying cylinder (14) of an offset printing machine, including a humidifying bucket (10);

a feeding pipe (8) that connects said annex compartment to said humidifying bucket;

a feedback pipe (12) that is capable of feeding said solution from said humidifying bucket to said main container;

wherein said injector is capable of projecting recycled portions of said solution at very high pressures so that said projected solution turns at high angular speeds in a helicoidal trajectory to form a 90° solid output cone, and a portion of particles of said projected solution collide against said deflecting surface and a remainder of said particles collide against said free surface of said solution.

7. The device of claim 6, wherein said injector (3) has an initial acceleration part (16) with a helicoidal trajectory and a second diffusion part (17) of toroidal configuration, so that the solution is projected over said free surface (13) and against said deflecting surface (4) at a lineal speed of 1.3–220 m/s and at a pressure of up to 1500 $kg/cm^2$.

8. The device of claim 7, wherein said lineal speed is 60 m/s and said pressure is 250 $kg/cm^2$.

9. The device of claim 6, wherein said deflecting surface (4) makes an angle of 0–30° with said liquid free surface (13).

10. The device of claim 9, wherein said deflecting surface (4) makes an angle of 15° with said liquid free surface (13).

* * * * *